(12) United States Patent
Chiu et al.

(10) Patent No.: US 12,366,807 B2
(45) Date of Patent: *Jul. 22, 2025

(54) EXPOSURE DEVICE AND METHOD

(71) Applicants: Chun-Jung Chiu, New Taipei (TW);
Chun-Hsiung Chen, New Taipei (TW);
Wan-Chen Chuang, New Taipei (TW)

(72) Inventors: Chun-Jung Chiu, New Taipei (TW);
Chun-Hsiung Chen, New Taipei (TW);
Wan-Chen Chuang, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/395,774

(22) Filed: Dec. 26, 2023

(65) Prior Publication Data

US 2024/0126177 A1  Apr. 18, 2024

Related U.S. Application Data

(63) Continuation-in-part of application No. 17/979,794, filed on Nov. 3, 2022, now Pat. No. 11,860,545.

(30) Foreign Application Priority Data

Nov. 4, 2021 (TW) ................... 110141110

(51) Int. Cl.
*G03F 7/00* (2006.01)

(52) U.S. Cl.
CPC ...... *G03F 7/70291* (2013.01); *G03F 7/70025* (2013.01); *G03F 7/70275* (2013.01)

(58) Field of Classification Search
CPC ............. G03F 7/70291; G03F 7/70025; G03F 7/70275; G03F 7/70308
See application file for complete search history.

(56) References Cited

U.S. PATENT DOCUMENTS 11,860,545 B2 * 1/2024 Chiu .................... G03F 7/70025
2006/0017902 A1 * 1/2006 Rhyzhikov ......... G03F 7/70291
355/53

* cited by examiner

*Primary Examiner* — Hung V Nguyen
(74) *Attorney, Agent, or Firm* — Chun-Ming Shih; LANWAY IPR SERVICES

(57) ABSTRACT

An exposure device and method for semiconductor manufacturing, focusing on the creation of exposure patterns with High Dynamic Range (HDR) capabilities, is disclosed. The exposure device includes a laser source, a first spatial light modulator (SLM), specifically a Liquid Crystal on Silicon (LCOS) device, and a second SLM, specifically a Digital Micromirror Device (DMD). The LCOS is positioned upstream in the optical path and is optimized for modulating the phase of the laser. It also directs the laser light towards specific areas on the DMD, crucial for enhancing detail and contrast in exposure patterns. The DMD, placed downstream, is composed of micromirrors that modulate the amplitude of the reflected laser, essential for achieving HDR in exposure patterns. This cooperative interaction between the LCOS and DMD allows for the creation of exposure patterns with a wide range of light intensities, from very bright to very dark, thereby achieving high dynamic range.

11 Claims, 8 Drawing Sheets

EXPOSURE DEVICE AND METHOD

BACKGROUND

Technical Field

The present disclosure relates to a semiconductor manufacturing device and more particularly relates to an exposure device and method.

Description of Related Art

Photolithography etches and forms a geometric structure on a photoresist layer by exposure and development, and then transfers the pattern formed on a mask to a substrate by etching, wherein the substrate is a silicon wafer or silicon carbide wafer commonly used in semiconductors or a printed circuit board generally used in electronic components. During the manufacturing process, the mask is one of the important components to determine the exposure pattern. However, the mask needs to go through complicated procedures such as design, testing and verification, which may take several months to complete, and thus prolonging the manufacturing process of the semiconductor components.

In order to overcome the problems of the mask, maskless lithography gradually gains favour in the market. As the name suggests, maskless lithography does not use any for exposure in order to form a pattern by the photoresist, thus omitting the mask and achieving the effect of maskless exposure. At present, maskless lithography is widely used in the production for small quantity and diverse variety of components, such as inductors, passive components, microelectromechanical systems (MEMS), etc.

In general, traditional common maskless exposure machines generate exposure patterns on the photoresist layer through a liquid crystal on silicon (LCOS) device or a digital micromirror device (DMD), but such method has the following drawbacks. For example, the liquid crystal modulation speed of LCOS is slow and the method requires a long exposure time, which does not meet the market requirements for the production of semiconductor components.

With reference to FIGS. 1A and 1B for the schematic views of developing a photoresist layer using the digital micromirror device (DMD) after exposure, the photoresist layer 11 is disposed on a wafer 10, and the digital micromirror device (DMD) is used to perform the exposure to a predetermined area 13 of the photoresist layer 11. In FIG. 1B, after the development, a part of the photoresist layer 11 is removed to form a pattern 12. However, due to diffraction, the light is often not 100% concentrated in the area to be exposed, and the area not to be exposed is often partially irradiated (especially near the edge of the area to be exposed). Therefore, the actually formed pattern 12 has an edge 14 unlike the one of the predetermined area 13 perpendicular to the wafer 10, but the formed pattern 12 is deviated. The edge 14 may be an inclined plane and the area of edge 14 may be smaller than or greater than the predetermined area 13, so that the pattern 12 cannot be accurately formed at the predetermined position. In other words, if the DMD is used for exposure, the phase cannot be changed, so that it will be unable to set the shape of the pattern accurately or sharply, and the development result will not be as expected (or will have a poor yield), especially in thick photoresist exposure.

Therefore, how to solve the problem is worthy of consideration by related manufacturers and those having ordinary skill in the art.

SUMMARY

The present invention pertains to an advanced exposure device and a corresponding method, specifically engineered for projecting a laser onto a photoresist layer. This invention introduces notable improvements in the field of semiconductor manufacturing, particularly focusing on the creation of exposure patterns with High Dynamic Range (HDR) capabilities. These advancements are in response to the need for higher precision and efficiency in semiconductor patterning, addressing some of the critical challenges prevalent in modern manufacturing processes.

At the heart of the exposure device is a configuration that includes a laser source, a first spatial light modulator (LCOS), and a second spatial light modulator (DMD). The first spatial light modulator, positioned upstream in the optical path, is a Liquid Crystal on Silicon (LCOS) device, responsible for modulating the phase of the incident laser. This modulator comprises a plurality of first pixels, each designed to reflect the laser after phase modulation. In a novel enhancement to its traditional role, the LCOS is also engineered to direct the laser light towards specific areas on the DMD, thus playing a crucial role in the precision and detail of the resulting exposure patterns.

Following the LCOS in the optical path is the second spatial light modulator, the Digital Micromirror Device (DMD), situated downstream. The DMD is composed of a plurality of second pixels, or micromirrors, each modulating the amplitude of the reflected laser. This modulation is vital for achieving the HDR aspect of the exposure pattern, providing a range of light intensities that translates into greater detail and contrast in the final pattern.

The cooperation between the LCOS and DMD is instrumental in creating exposure patterns with HDR capabilities. The first spatial light modulator sets the stage by directing phase-modulated laser light towards the DMD in an optimized manner. The DMD then finely tunes the amplitude of this directed laser, thereby adding depth and contrast to the exposure pattern. This synergy allows for the creation of exposure patterns with a broad spectrum of light intensities, encompassing very bright to very dark regions, thus achieving a high dynamic range.

Furthermore, the inventive arrangement of the LCOS and DMD in the optical path significantly impacts the speed and efficiency of the exposure process. By placing the LCOS upstream and the DMD downstream, the device leverages the inherent speed of light in the optical path. This arrangement effectively compensates for the slower modulation speed of the LCOS, ensuring that the faster modulation activities of the DMD are not bottlenecked. Additionally, minor adjustments in the angle of light by the LCOS lead to significant positional shifts at the DMD due to the optical path length. This feature enables precise control over the distribution of light on the photoresist layer, enhancing the precision of the exposure pattern.

The exposure device also includes a projection lens installed between the second spatial light modulator and the photoresist layer, focusing the laser reflected by the DMD onto the photoresist layer to form the exposure pattern. Moreover, the device comprises a beam expander disposed on the path of the laser, which irradiates the first spatial light modulator.

The corresponding exposure method, encompassing the steps of emitting a laser, modulating its phase and amplitude, and projecting it onto a photoresist layer, is tailored to capitalize on the device's HDR capabilities. The method includes directing the laser to specific areas on the DMD as modulated by the LCOS and dynamically adjusting the contrast and intensity of the laser light for the creation of the HDR exposure pattern.

In essence, this invention offers a sophisticated solution to the challenges in semiconductor exposure processes, enhancing the capabilities in creating detailed and contrast-rich patterns necessary for advanced semiconductor fabrication. The exposure device and method, with their innovative features and functionalities, represent a significant advancement in the technology of semiconductor manufacturing, providing enhanced precision, efficiency, and adaptability in exposure patterns.

DESCRIPTION OF THE EMBODIMENTS

This disclosure will now be described in more detail with reference to the accompanying drawings that show various embodiments of this disclosure.

Figure 1A:
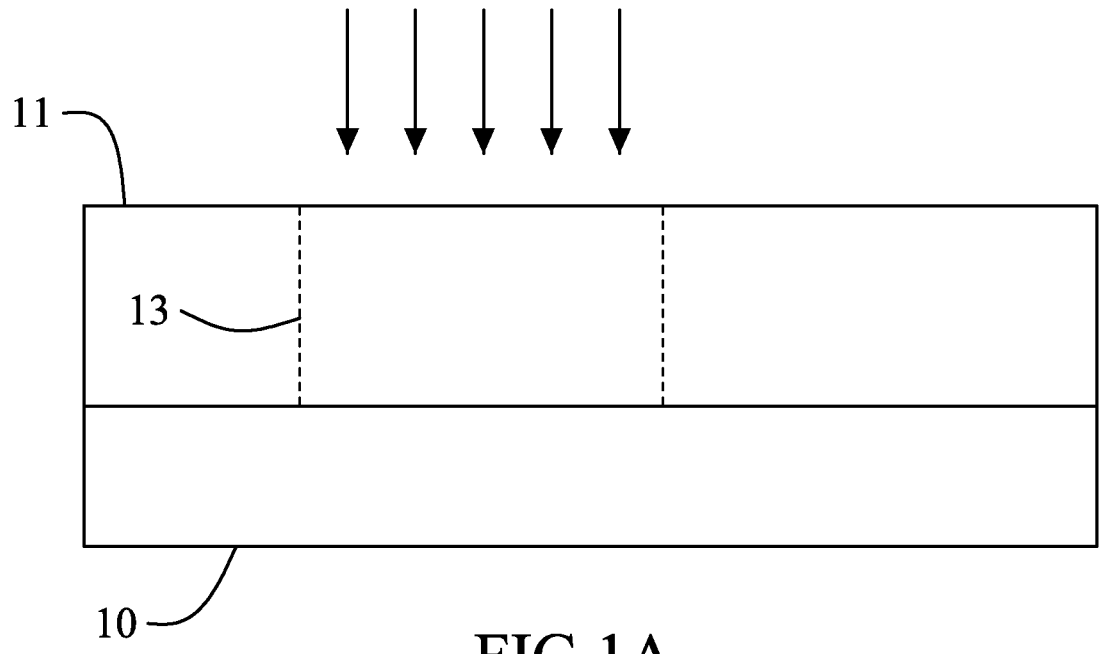
FIGS. 1A and 1B are schematic views showing the exposure and development of a photoresist layer using MDM.
Figure 1B:
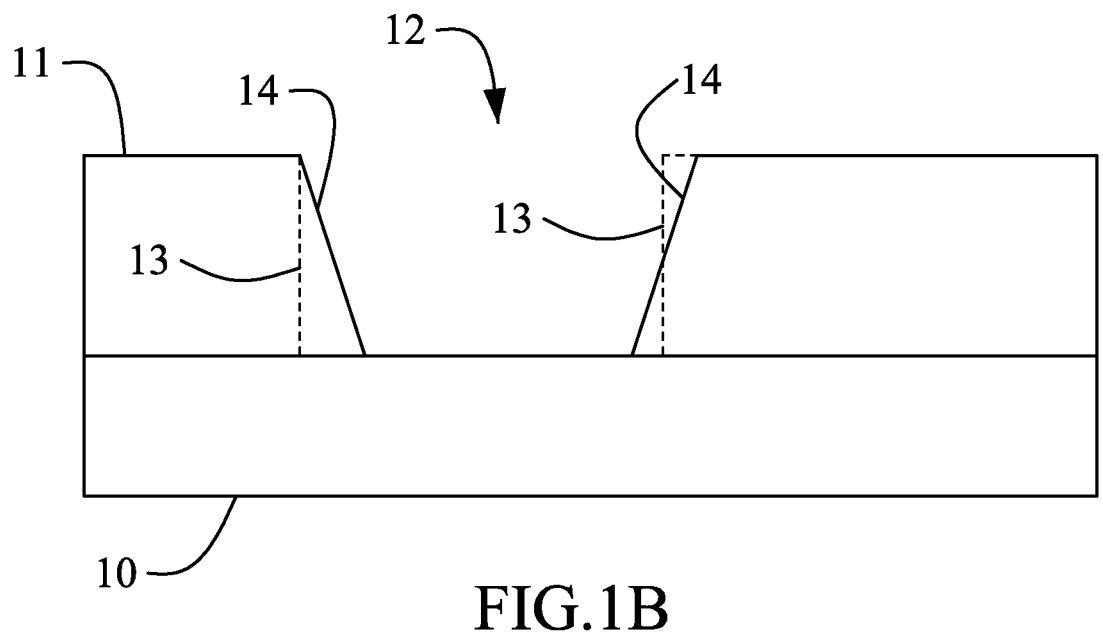
Figure 2A:
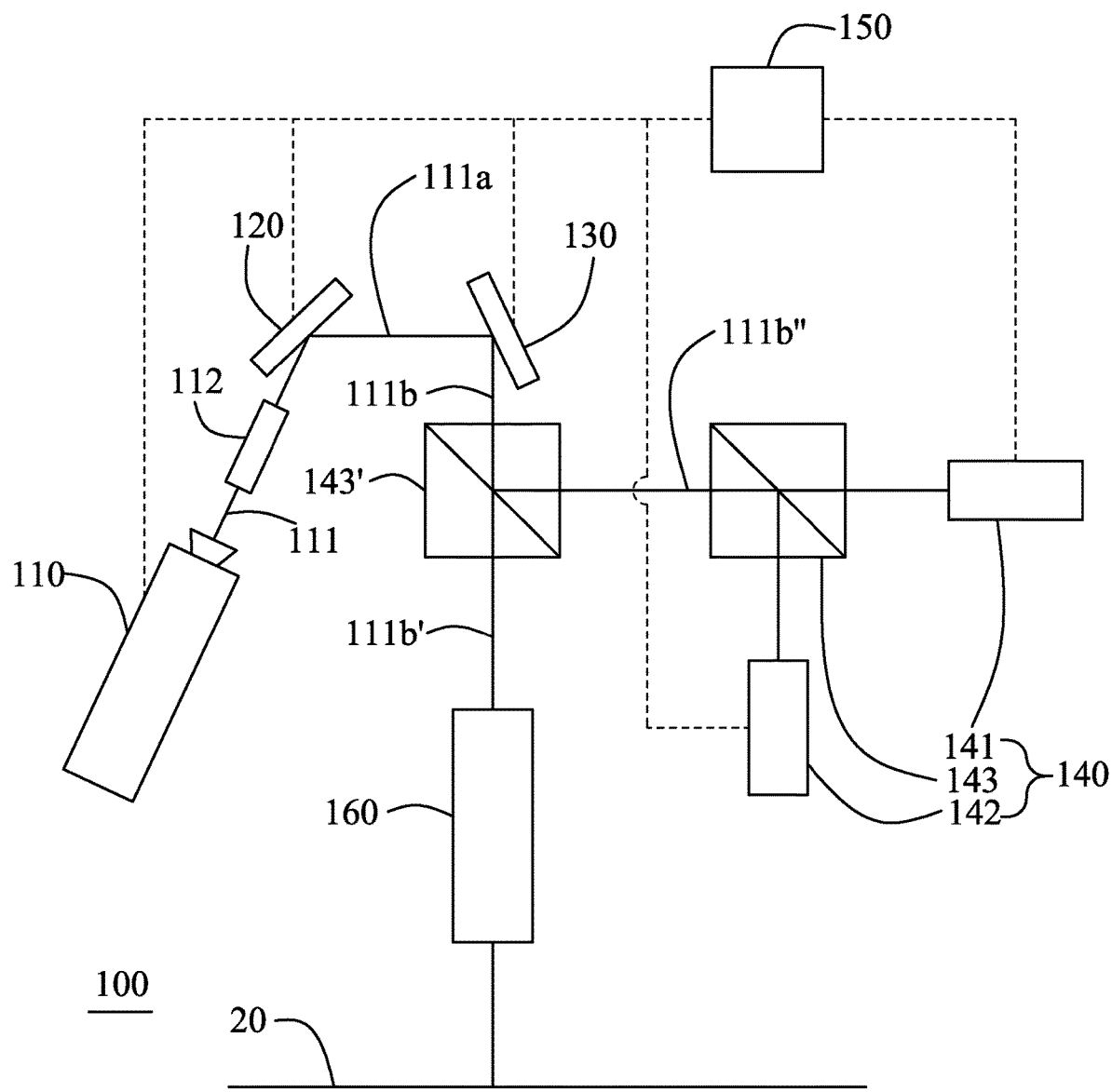
FIG. 2A is a schematic view of an exposure device of this disclosure.
Figure 2B:
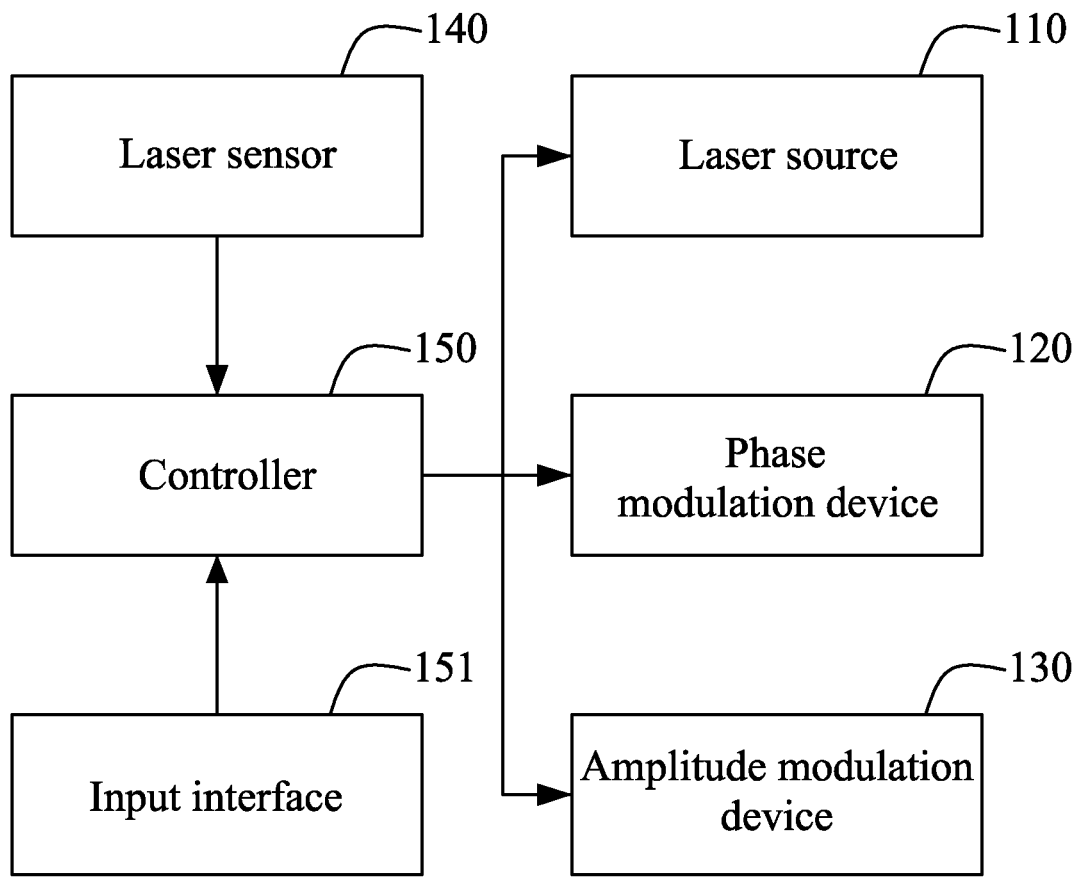
FIG. 2B is a schematic block diagram of an exposure device of this disclosure.
Figure 7A:
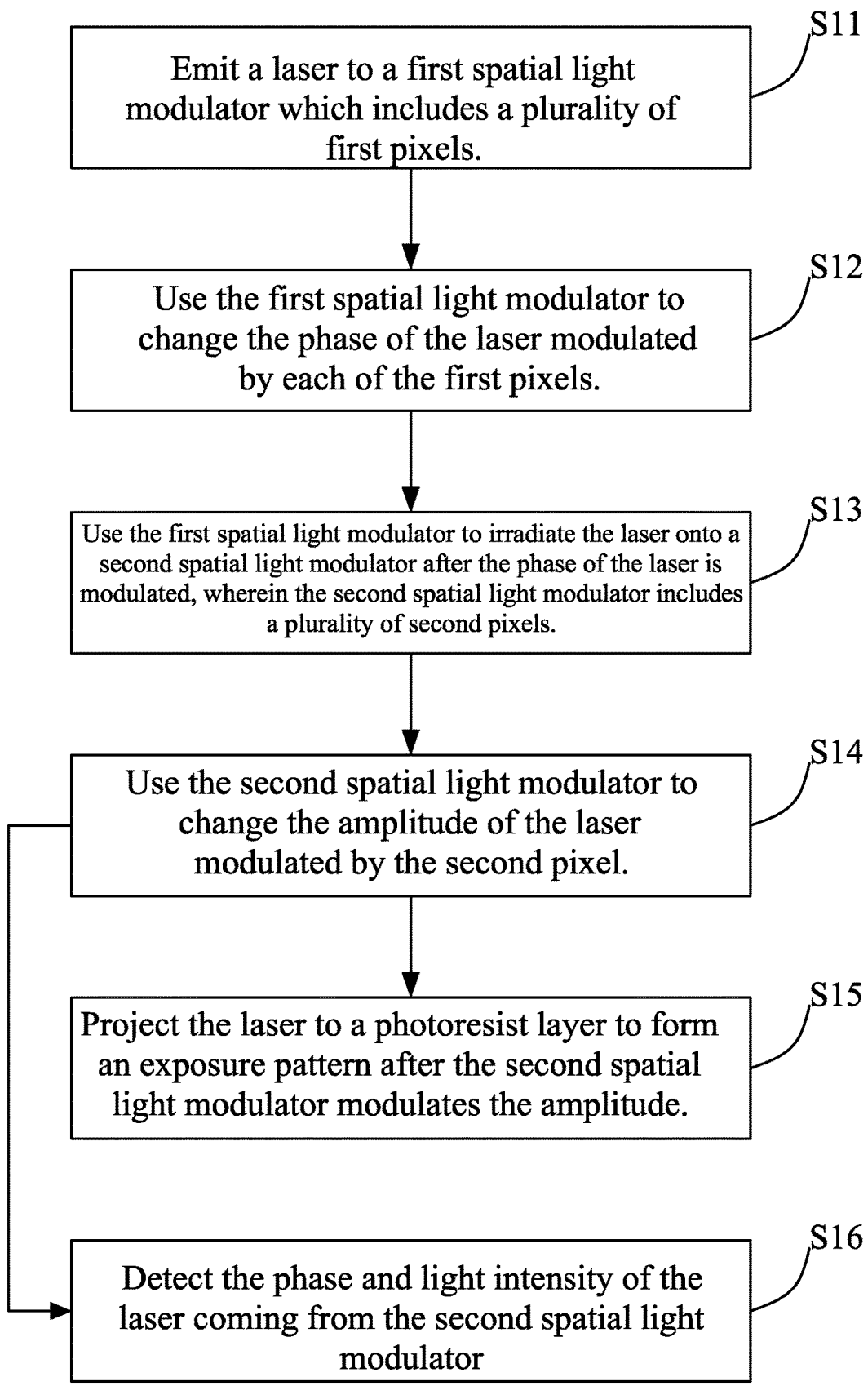
FIG. 7A is a flow chart of an exposure method of this disclosure.
Figure 7B:
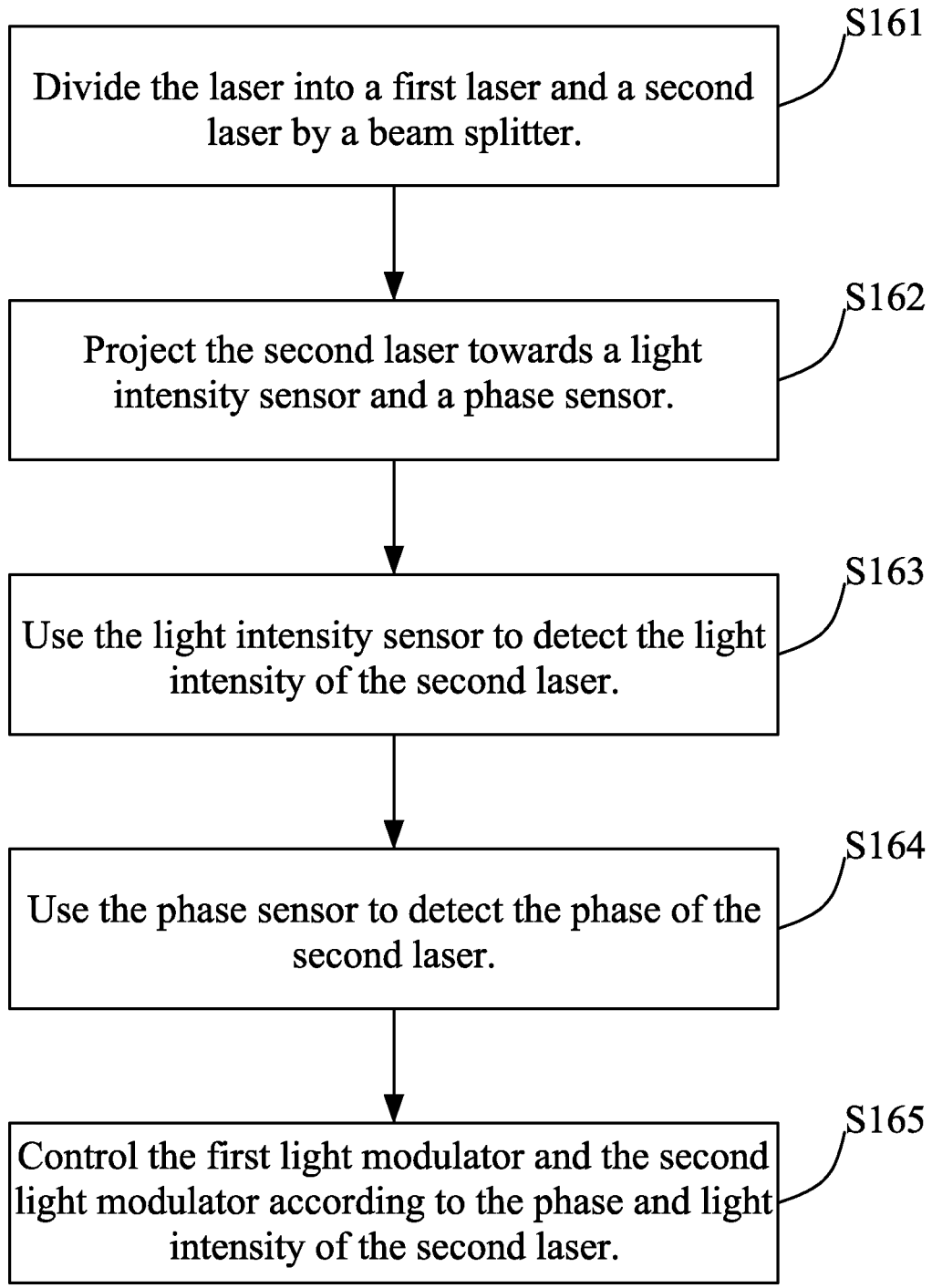
FIG. 7B is a flow chart of detecting the phase and light intensity in the exposure method of this disclosure.

This disclosure provides an exposure device and an exposure method, and uses a spatial light modulator to modulate the phase and amplitude of a laser, and makes use of the lasers with different phases and amplitudes to interfere and offset each other to form a more accurate exposure pattern. With reference to FIGS. 2A, 2B and 7A for the schematic views of an exposure device 100, the structure of the exposure device 100 and an exposure method of this disclosure respectively, the exposure device 100 includes a laser source 110, a beam expander 112, a first spatial light modulator 120, a second spatial light modulator 130, a sensor 140, a controller 150 and a projection lens 160.

Firstly, the Step S11 is carried out to emit a laser 111 to a first spatial light modulator 120. The laser source 110 as described in the Step S11 is provided for emitting the laser 111. The first spatial light modulator 120 is installed on the path of the laser 111 and irradiated by the laser 111. The beam expander 112 is installed between the laser source 110 and the first spatial light modulator 120 and disposed on the path of the laser 111, so that the laser 111 passes through the beam expander 112 and irradiates the first spatial light modulator 120. When the laser 111 passes through the beam expander 112, the irradiation radius of the laser 111 will be expanded to increase the area of the first spatial light modulator 120 which is irradiated by the laser 111. In some embodiment, when the laser 111 passes through the beam expander 112, the laser 111 will cover the entire first spatial light modulator 120. In this embodiment, the first spatial light modulator 120 is a liquid crystal on silicon (LCOS) device, so that the first spatial light modulator 120 includes a plurality of first pixels 201, each being used for reflecting the laser 11 after the phase of the laser 111 irradiated on the first spatial light modulator 120 is modulated, and the phase of the reflected laser 111a can be changed. Then, Step S12 is proceeded, and the first spatial light modulator 120 changes the phase of the laser modulated by each first pixel 201.

Figure 3A:
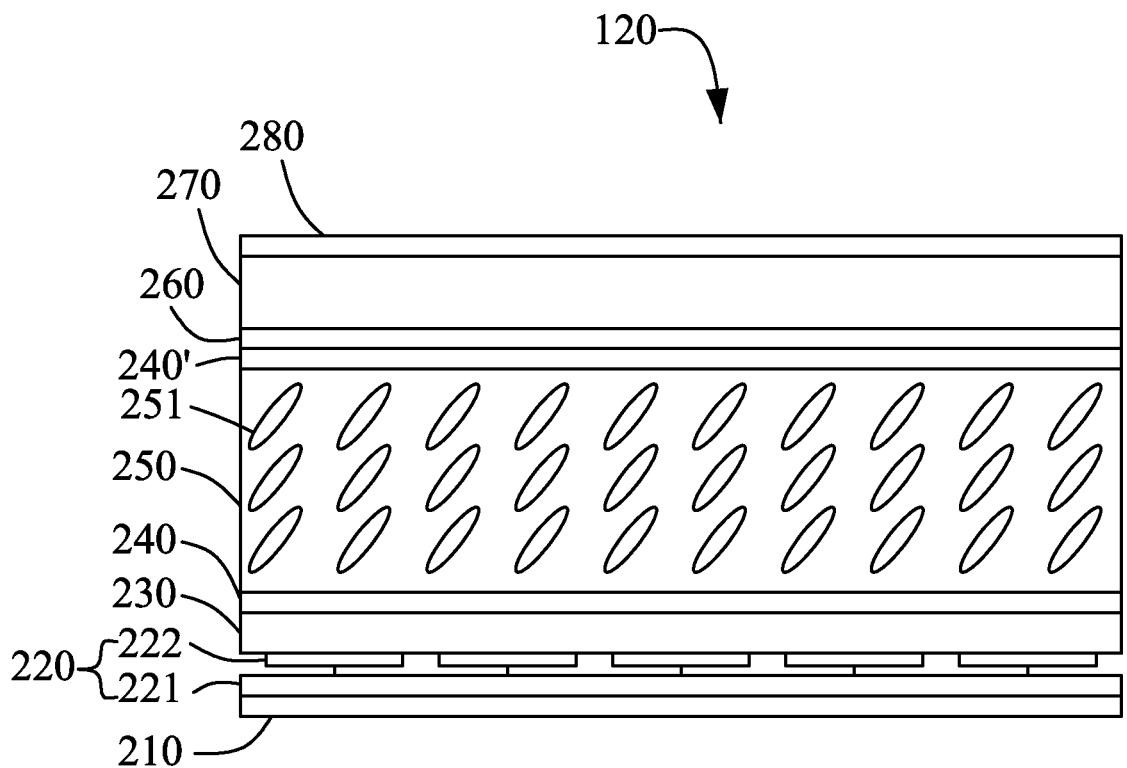
FIG. 3A is a schematic view of a first spatial light modulator which is a liquid crystal on silicon (LCOS) device in accordance with some embodiment of this disclosure.

With reference to FIG. 3A for the schematic view of a liquid crystal on silicon (LCOS) device uses as the first spatial light modulator in accordance with some embodiment of this disclosure, the liquid crystal on silicon (LCOS) device used as the first spatial light modulator 120 includes a substrate layer 210, a complementary metal oxide semiconductor (CMOS) layer 220, a reflective layer 230, two alignment layers 240, 240', a liquid crystal layer 250, a transparent electrode layer 260 and a cover glass 270. The CMOS layer 220 includes a CMOS circuit layer 221 and a plurality of pixel electrodes 222, and the reflective layer 230 is disposed on the CMOS layer 220, and the alignment layer 240 is disposed above the reflective layer 230, and the liquid crystal layer 250 is disposed between the two alignment layers 240, 240'. The transparent electrode layer 260 is disposed above the alignment layer 240', and the transparent electrode layer 260 has a plurality of transparent electrodes (not shown in the figure), each being configured to be corresponsive to one of the pixel electrodes 222. In other words, the transparent electrode and the pixel electrode 222 are configured in pairs. The cover glass 270 covers the top of the transparent electrode layer 26 for protecting each component in the liquid crystal on silicon (LCOS) device, in addition to receiving external light. Further, the top of the cover glass 270 has an anti-reflective layer 280 such as an anti-reflective coating.

Figure 3B:
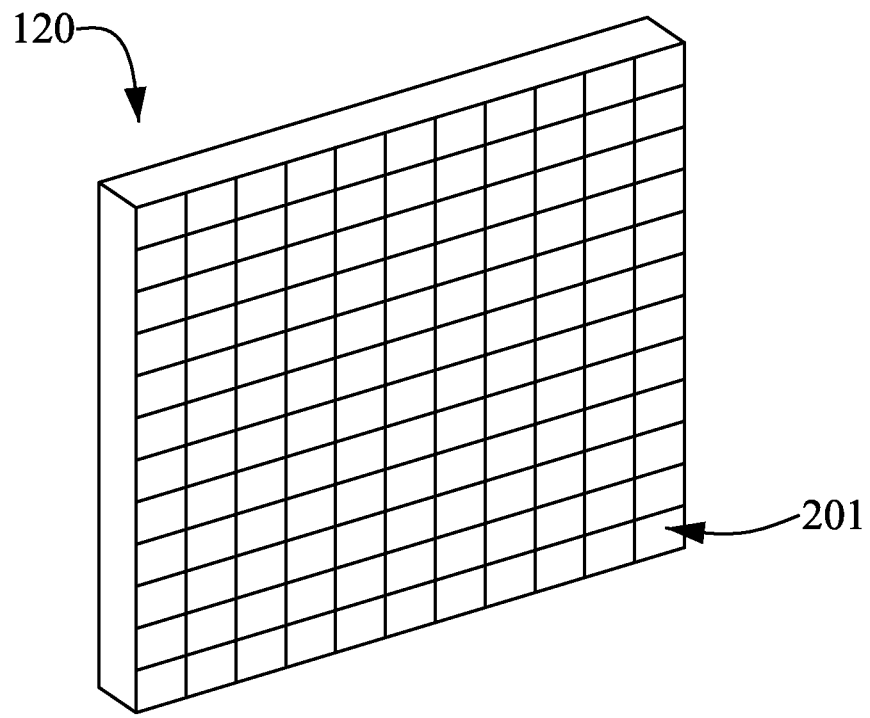
FIG. 3B is a schematic perspective view of a first spatial light modulator of this disclosure.

With reference to FIG. 3B for the perspective view of a liquid crystal on silicon (LCOS) device uses as a first spatial light modulator 120 of this disclosure, the viewing plane of the liquid crystal on silicon (LCOS) device is divided into a plurality of first pixels 201, each being configured to be corresponsive to one of the pixel electrodes 222 and the transparent electrode. In this embodiment, the liquid crystal on silicon (LCOS) device receives an external control signal through the CMOS circuit layer 221 to control the electrical property of the transparent electrode on the pixel electrode 222 and the transparent electrode layer 260, so that the liquid crystal 251 in the liquid crystal layer 250 corresponding to each pixel electrode can rotate, and after light enters into the liquid crystal on silicon (LCOS) device, the light is affected by the rotated liquid crystal 251 and the phase of the light will be changed. In addition, the direction of the liquid crystal 251 corresponding to each first pixel 201 is controlled by the pixel electrode 222 and the transparent electrode, so that the phase of the light emitted by each first pixel 201 can be controlled.

In FIGS. 2A and 7A, the Step S13 is carried out to irradiate a laser 111 to the second spatial light modulator 130 after the first spatial light modulator 120 modulates the phase of the laser 111a. The second spatial light modulator 130 is installed on the path of the laser 111a reflected by the first spatial light modulator 120. In addition, the second spatial light modulator 130 includes a plurality of second pixels, each second being used for reflecting the laser 111a after the amplitude of the laser 111a is modulated. In this embodiment, the second spatial light modulator 130 is a digital micromirror device (DMD) that can reflect the laser 111a, and the amplitude of the reflected laser 111b will be changed. Therefore, when the Step S14 is carried out, the second spatial light modulator 130 changes the amplitude of the laser 111b modulated by the second pixel.

Figure 4:
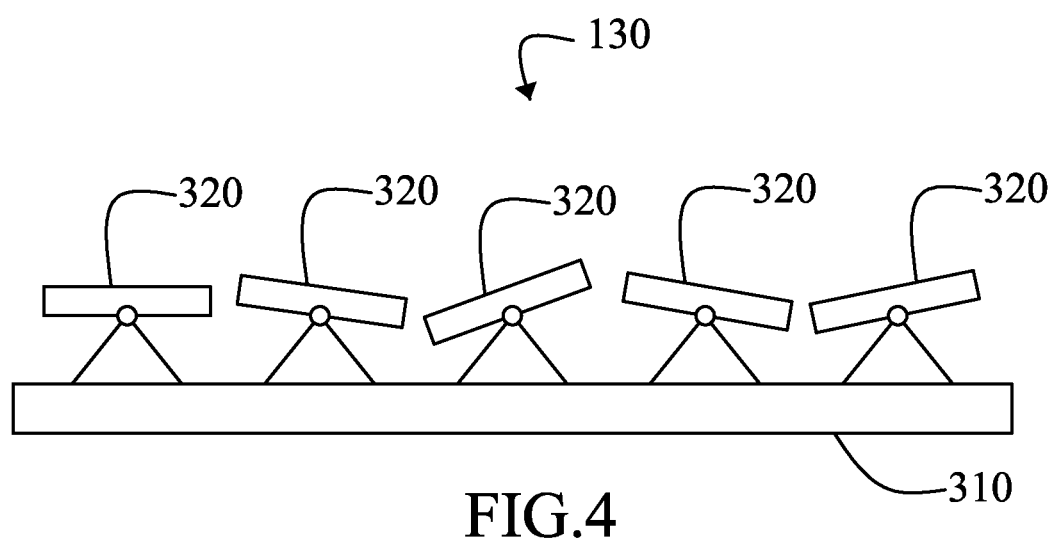
FIG. 4 is a schematic perspective view of a second spatial light modulator of this disclosure.

With reference to FIG. 4 for the schematic view of a second spatial light modulator in accordance with some embodiment of this disclosure, the second spatial light modulator 130 further includes a plurality of second pixels, which are micromirrors 320 in this embodiment, and these micromirrors 320 are installed on a substrate 310. In this embodiment, each micromirror 320 corresponds to one of the first pixels 201 on the first spatial light modulator 120 (as shown in FIG. 3B). Each micromirror 320 can control and change an angle, so that the micromirror 320 has the ON or OFF effect. For example, when the angle relative to the horizontal plane is positive 12°, the micromirror 320 is turned on, and when it is negative 12°, the micromirror 320 is turned off, and the frequency of turning on/off the micromirror 320 can also be controlled. By adjusting the different frequency of switching on and off the micromirrors 320, the laser 111a can be reflected, so that the laser 111a reflected by the micromirror 320 with different switching frequencies can accumulate different energies, so as to the effect of adjusting the amplitude (i.e.: the intensity) of the laser 111a irradiated on the photoresist layer 20. After being reflected by the second spatial light modulator 130, the laser 111b is projected onto the photoresist layer 20 through the projection lens 160 to form an exposure pattern 400 as shown in FIG. 5.

In FIGS. 2A and 7A, the Step S15 is carried out, and the laser 111b modulated by the second spatial light modulator 130 is irradiated on the photoresist layer 20 to form an exposure pattern 400. After the laser passes through the first spatial light modulator 120, the phase of the laser emitted by each first pixel 201 can be adjusted. In addition, the laser passes through the second spatial light modulator 130, the adjusted laser is irradiated on the photoresist layer 20 with an intensity distribution, so as to have bright and dark distributions on the surface of the photoresist layer 20 and form an exposure pattern 400 as shown in FIG. 5.

Figure 5:
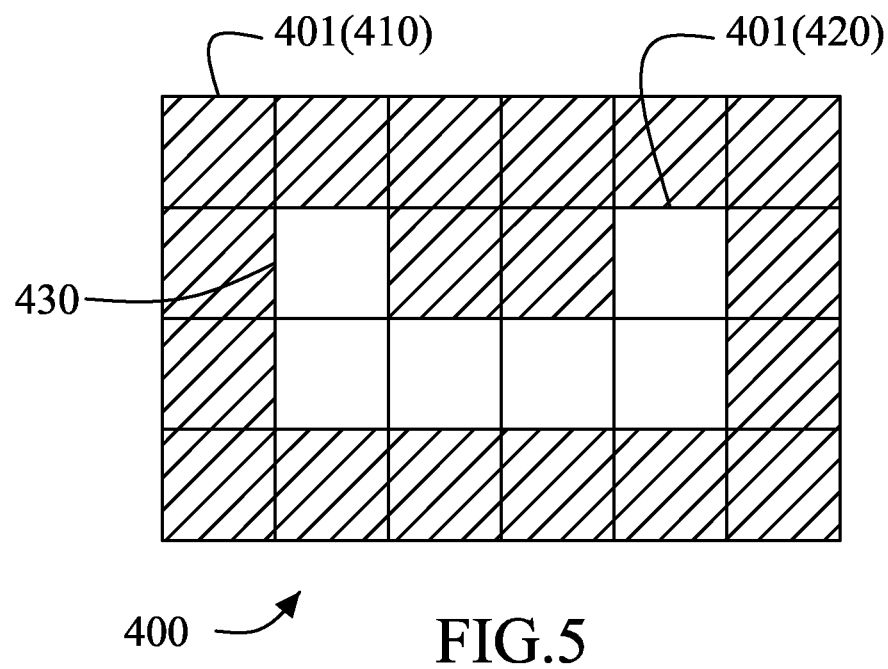
FIG. 5 is a schematic view of forming an exposure pattern of this disclosure.

With reference to FIG. 5 for the schematic view of the exposure pattern 400, the exposure pattern 400 can be regarded as being formed by a plurality of third pixels 401 arranged in an array, and the third pixel 401 includes a third dark-area pixel 410 and a third bright-area pixel 420, and each third pixel 401 corresponds to one of the first pixels 201 on the first spatial light modulator 120 and one of the micromirrors 320 on the second spatial light modulator 130.

The first pixel 201 corresponding to the third pixel 401 includes a plurality of first dark-area pixels and a plurality of first bright-area pixels, and the third dark-area pixel 410 corresponds to the first dark-area pixel, and the third bright-area pixel 420 corresponds to the first bright-area pixel. The phases of the laser modulated by at least two first bright-area pixel of the adjacent first dark-area pixels differ by 180° with each other.

Figure 6A:
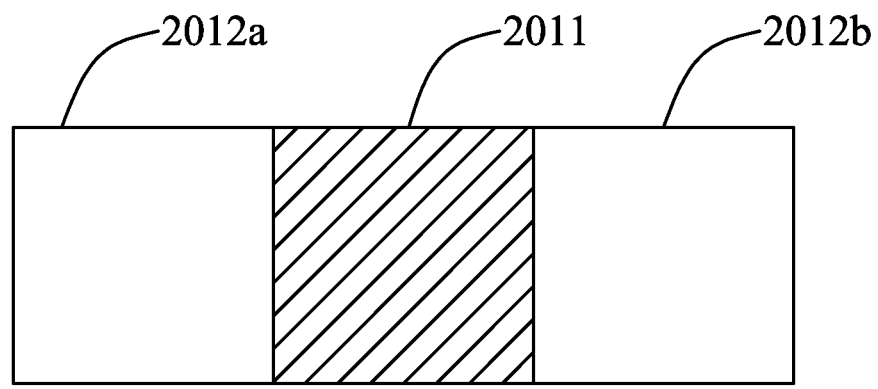
FIG. 6A is a schematic view of a first pixel of this disclosure.

With reference to FIG. 6A for the schematic view of a first pixel, only three first pixels 201 are shown in FIG. 6A for simplicity, and the first pixel includes one first dark-area pixel 2011 and two adjacent first bright-area pixels 2012a, 2012b. In this embodiment, the first bright-area pixels 2012a, 2012b are disposed on the left and right sides of the first dark-area pixel 2011 respectively. After the first bright-area pixels 2012a, 2012b modulate the lasers, the phases of the modulated lasers differ by 180° with each other. In other words, the phases of the lasers modulated by the first bright-area pixel 2012a, 2012b differ by 180° with each other.

Figure 6B:
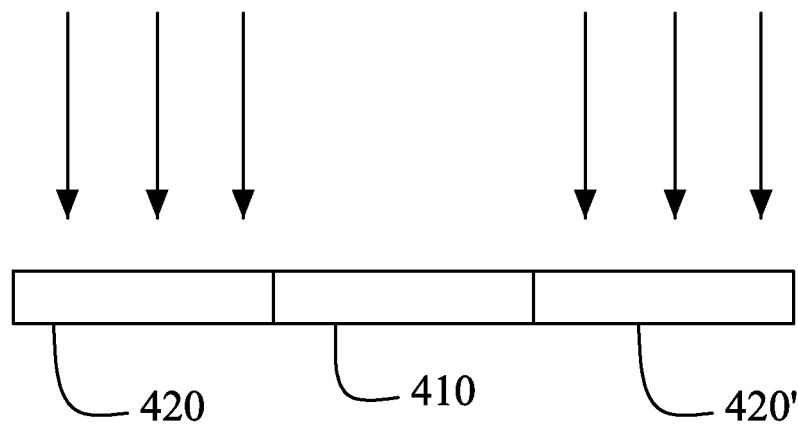
FIG. 6B is a schematic view of forming an exposure pattern formed by a laser of this disclosure.

With reference to FIG. 6B for the schematic view of the exposure pattern formed by the laser, the laser reflected by the first bright-area pixel 2012a is projected onto the third bright-area pixel 420, and the laser reflected by the first bright-area pixel 2012b is projected onto the third bright-area pixel 420'.

Figure 6C:
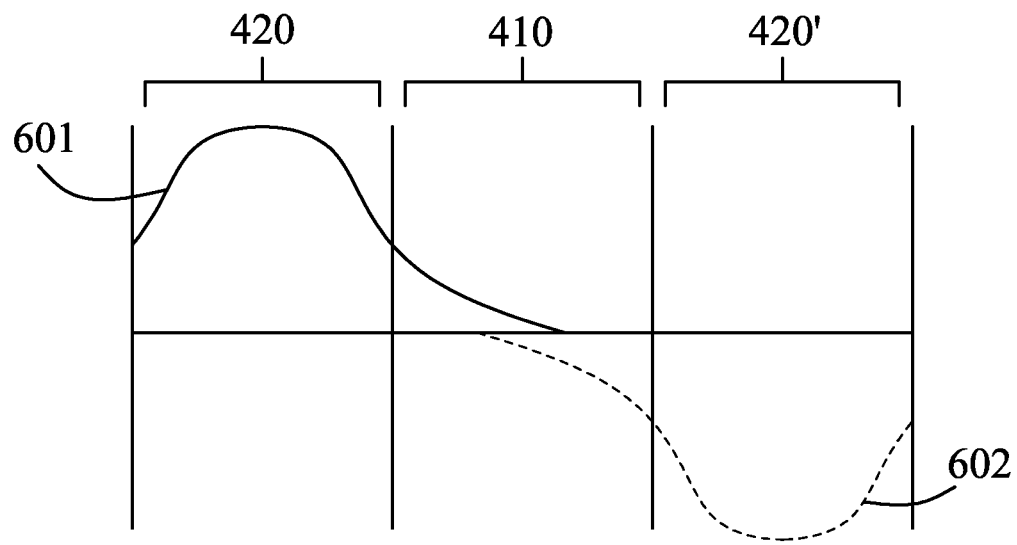
FIG. 6C is a schematic view showing the light intensity of a third pixel at a time point of this disclosure.

With reference to FIG. 6C for the schematic view showing the light intensity of the third pixel at a time point, the curve 601 shows the light intensity of the laser reflected by the first bright-area pixel 2012a and projected onto the third bright-area pixel 420. The curve 602 shows the light intensity of the laser reflected by the first bright-area pixel 2012b and projected onto the third bright-area pixel 420'. Due to the light diffraction, a part of the laser is projected onto the third dark-area pixel 410. The laser reflected by the first bright-area pixel 2012a, 2012b has a phase difference of 180°, so that the phase of the laser projected onto the third bright-area pixels 420, 420' are in opposite states, and the lasers diffracted onto the third dark-area pixel 410 will be interfered and offset with each other due to the lasers reflected by the first bright-area pixels 2012a, 2012b. In this way, the light projected on the third dark-area pixel 410 can be effectively reduced, and further, when the exposure pattern is formed, the distinction between the third bright-area pixel 420 and the third dark-area pixel 410 can be clearer. The micromirror 320 corresponding to the third pixel 401 of the third dark-area pixel 410 has a deflection angle, so that the reflected laser will not irradiate on the third dark-area pixel 410. On the contrary, the deflection angle of the micromirror 320 corresponding to the third pixel 401 of the third bright-area pixel 420 can irradiate the reflected laser on the third bright-area pixel 420.

Additionally, in this embodiment, exposure patterns 400 with high dynamic range (HDR) capabilities can be achieved through the collaborative interaction between the first spatial light modulator 120 and the second spatial light modulator 130, essentially creating highly detailed exposure patterns 400. High dynamic range, in this context, refers to the exposure device 100's ability to create exposure patterns with a significantly wider range of light intensities, offering greater detail and contrast. This is achieved through cooperative interaction between the first spatial light modulator 120 (the Liquid Crystal on Silicon, or LCOS) and the second spatial light modulator 130 (the Digital Micromirror Device, or DMD). The LCOS, serving as the first spatial light modulator 120, is optimized not only to modulate the phase of the laser 111 but also to precisely direct the laser 111 towards specific areas on the second spatial light modulator 130. This targeted directionality is crucial for concentrating light intensity where it is most needed, thereby enhancing the DMD's effectiveness in creating highly detailed exposure patterns 400. The DMD, as the second spatial light modulator 130, plays a pivotal role in dynamically adjusting the amplitude and contrast of the laser 111, further refining the exposure pattern 400. The dynamic modulation capability of the DMD is essential for realizing the full potential of HDR, allowing for the creation of exposure patterns 400 with heightened precision and contrast levels.

That is to say, by directing the laser 111 towards the micromirrors 320 on the second spatial light modulator 130 that should be illuminated, rather than towards those that should not, the third dark-area pixel 410 in the exposure pattern 400 becomes darker, and the third bright-area pixel 420 becomes brighter, thus making the energy utilization more efficient. In other words, without high dynamic range, the micromirrors 320 corresponding to the third dark-area pixel 410 would merely redirect the laser 111 incident upon them to areas other than the third dark-area pixel 410, essentially wasting that portion of the laser 111.

In addition to the high dynamic range capabilities, this application also details a novel arrangement of the optical path, specifically positioning the first spatial light modulator (LCOS) 120 upstream and the second spatial light modulator (DMD) 130 downstream in the laser's (laser source 110) path. This arrangement leverages the inherent speed of light to effectively compensate for the slower modulation speed (in the kHz range) of the first spatial light modulator 120. By placing the first spatial light modulator 120 upstream, it modulates the laser 111 first, thus ensuring that the subsequent faster modulation (in the MHz range) by the the second spatial light modulator 130 is not bottlenecked by the slower the first spatial light modulator 120. The distance between the LCOS 120 and the second spatial light modulator 130 in the optical path plays a critical role here. Even minor adjustments in the angle of light by the the first spatial light modulator 120 can result in significant positional shifts by the time the light reaches the second spatial light modulator 130, due to the length of the optical path. This strategic placement not only optimizes the use of light but also significantly enhances the overall speed and efficiency of the exposure process.

The integration of HDR capabilities, combined with the thoughtful arrangement of the optical components, represents a substantial leap forward in the technology of exposure devices. These enhancements are not merely incremental improvements but are pivotal in addressing some of the critical challenges faced in modern semiconductor manufacturing, particularly in the realms of precision, efficiency, and adaptability of exposure patterns.

In the following, we will provide a more detailed introduction to how the first spatial light modulator (LCOS) 120 and the second spatial light modulator (DMD) 130 collaboratively work to achieve exposure patterns 400 with high dynamic range capabilities. The LCOS, serving as the first spatial light modulator 120 in the optical path, has been traditionally recognized for its ability to modulate the phase of the laser 11. In this embodiment, the LCOS 120 extends beyond its conventional role by also directing the laser light towards specific areas on the DMD 130. This directional control is crucial for concentrating the light intensity in areas where it is most beneficial, especially in areas requiring heightened detail and contrast.

Each pixel of the LCOS 120, also known as the first pixel 201 as shown in FIG. 3B, consists of a liquid crystal layer 250. These pixels align precisely to modulate the phase of the incident laser 11. When the laser 11 is modulated, the LCOS 120 also induces subtle but significant directional changes. These changes are instrumental in shaping the trajectory of the laser 11 towards the DMD 130. Such control is achieved by manipulating the orientation of the liquid crystals 251, which in turn alters the path of the laser 11 through refraction. This precise manipulation at the LCOS 120 level ensures that the light reaches the DMD 130 with an optimized distribution, laying the groundwork for effective HDR implementation.

Following the LCOS 120, the DMD acts as the second spatial light modulator 130 in the optical path. Its primary role is to modulate the amplitude of the laser 11, a function that is now vital for the HDR capabilities. The DMD 130, consisting of thousands of micromirrors 320, each corresponding to a pixel, also referred to as the second pixel 320, is capable of extremely rapid and precise adjustments.

The micromirrors 320 of the DMD pivot in response to control signals from the controller 150, adjusting the angle at which they reflect the incoming laser 11. These minute adjustments result in changes to the intensity and contrast of the light projected onto the photoresist layer 20. The DMD's ability to rapidly switch between states (i.e., the on and off positions of the micromirrors) allows for the dynamic modulation of the laser 11. This rapid modulation is crucial for creating exposure patterns 400 with high contrast and fine details—hallmarks of HDR.

In essence, the cooperative interaction between the LCOS 120 and DMD 130 is central to achieving HDR in the exposure patterns 420. The LCOS 120 sets the stage by directing the phase-modulated laser 11 to the DMD 130 in an optimized manner. Following this, the DMD 130 finely tunes the amplitude of this directed laser 11, adding depth and contrast to the exposure pattern 420. This synergy allows for the creation of exposure patterns 420 with a broad range of light intensities, from very bright to very dark, thereby achieving the high dynamic range.

With reference to FIGS. 2A and 7A again, a sensor 140 of one of the embodiments is installed between the second spatial light modulator 130 and the photoresist layer 20 and provided for detecting the phase and light intensity of the laser 111b emitted from the second spatial light modulator 130 in the Step S16. In addition, a projection lens 160 is installed on the path of the laser 111b reflected from the second spatial light modulator 130, and the laser 111b passes through the projection lens 160 and then projects onto the photoresist layer 20 to form the exposure pattern 400 on the photoresist layer 20.

In some embodiment, the sensor 140 includes a plurality of beam splitters 143, 143', a light intensity sensor 142, and a phase sensor 141. The beam splitter 143' is installed between the second spatial light modulator 130 and the projection lens 160 and provided for dividing the incident laser 111b into a first laser 111b' and a second laser 111b". Further, the ratio of the light intensity of the first laser 111b' to the light intensity of the second laser 111b" is 99:1, i.e. the beam splitter 143' will project 1% of the divided laser into a light intensity sensor 142 and a phase sensor 141. In some embodiment as shown in FIG. 2A, the second laser 111b" is split by a beam splitter 143, and projected to light intensity sensor 142 and the phase sensor 141. The sensor 140 receives the second laser 111b" through the light intensity sensor 142 and the phase sensor 141 to generate a sensing signal.

With reference to FIGS. 2B to 7B, FIG. 7B shows a flow chart of detecting the phase and light intensity in the exposure method of this disclosure, and the controller 150 is electrically connected to the laser source 110, the first spatial light modulator 120, the second spatial light modulator 130 and the sensor 140. The controller 150 is a programmable logic controller or a computer device with a control program. The controller 150 is provided for receiving a sensing signal, and controlling the light intensity and phase of the laser outputted by the laser source 110 according to the sensing signal, and the control method includes the following steps:

S161: The beam splitter 143' is used to divide the laser 111b into a first laser 111b' and a second laser 111b", wherein the first laser 111b' is the laser irradiated on the photoresist layer 20 as described in the Step S15.

S162: The second laser 111b" is projected on a light intensity sensor 142 and a phase sensor 141, and another beam splitter 143 is used to drive the second laser 111b" to enter into the light intensity sensor 142 and the phase sensor 141 separately.

S163: The light intensity sensor 142 detects the light intensity of the second laser 111b".

S164: The phase sensor 141 is used to detect the phase of the second laser 111b".

S165: The first light modulator 120 and the second light modulator 130 are controlled according to the phase and light intensity of the second laser 111b", and the formed exposure pattern 400 is corrected.

In some embodiment, the steps S15 and S16 (which are the steps S161-S165) are performed synchronously. While the exposure pattern 400 is being formed, the exposure pattern 400 formed by the laser can be dynamically adjusted through the steps S161-S165, and the exposure pattern 400 can be continuously corrected during the exposure process, further ensuring that the exposure pattern 400 matches the expected pattern.

More specifically, the controller 150 compares the laser parameter measured by the sensor 140 with a predetermined laser parameter, and if the measured laser parameter does not match the predetermined laser parameter, the controller 150 will control the laser source 110 to adjust the light intensity and phase of the incident laser, until the laser parameter measured by the sensor 140 matches the predetermined laser parameter.

In some embodiment, the controller 150 further includes an input interface 151 provided for an operator to enter a predetermined laser parameter. In addition, the input interface 151 is also provided for the operator to input a desired exposure pattern, so that the controller 150 can further operate the first spatial light modulator 120 and the second spatial light modulator 130 to form the desired exposure pattern on the photoresist layer 20 according to the data of inputted exposure pattern.

The exposure device and method of this disclosure have the advantages of forming a more precise or sharp exposure pattern, improving the yield of development, and overcoming the drawbacks of the related art by means of modulating the of the phase and amplitude of the laser and using the mutual interference and offset of the laser between pixels.

Although the invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An exposure device, configured for projecting a laser onto a photoresist layer, and the exposure device comprising:
a laser source, for emitting a laser;
a first spatial light modulator, irradiated by the laser, comprising a plurality of first pixels, each first pixel being used for reflecting the laser after the phase of the laser irradiated thereon is modulated, wherein the first spatial light modulator is a liquid crystal on silicon device positioned upstream in the optical path;
a second spatial light modulator, irradiated by the laser reflected by the first spatial light modulator, comprising a plurality of second pixels, each second pixel being used for reflecting the laser after the amplitude of the laser irradiated thereon is modulated, wherein the second spatial light modulator is a digital micromirror device positioned downstream in the optical path and comprises a plurality of micromirrors used as the second pixels;
a controller, electrically coupled to the laser source, the first spatial light modulator, and the second spatial light modulator, for controlling the laser source, the first spatial light modulator, and the second spatial light modulator;
wherein the first spatial light modulator and the second spatial light modulator are configured to cooperatively create an exposure pattern with high dynamic range capabilities, and the exposure pattern comprises a plurality of third pixels, and the first pixel, the second pixels correspond to the third pixels respectively.

2. The exposure device of claim 1, wherein the high dynamic range capability of the exposure pattern is achieved by the first spatial light modulator directing the laser to specific areas on the second spatial light modulator, and the second spatial light modulator dynamically adjusting the contrast and intensity of the laser light on the exposure pattern.

3. The exposure device of claim 1, wherein the first spatial light modulator modulates the phase of the laser at a kHz range speed, and the second spatial light modulator modulates the amplitude of the laser at a MHz range speed; further wherein the arrangement of the first spatial light modulator upstream and the second spatial light modulator downstream in the optical path leverages the speed of light in the optical path to compensate for the slower modulation speed of the first spatial light modulator, thereby optimizing the overall exposure process speed.

4. The exposure device of claim 1, wherein a minor adjustment in the angle of light by the first spatial light modulator results in a significant positional shift of the light at the second spatial light modulator, due to the optical path length between them; this positional shift enables precise control over the distribution of light on the photoresist layer, thereby enhancing the precision of the exposure pattern.

5. The exposure device according to claim 1, further comprising a projection lens installed between the second spatial light modulator and the photoresist layer, wherein the projection lens focuses the laser reflected by the second spatial light modulator and irradiates the laser on the photoresist layer to form the exposure pattern.

6. The exposure device according to claim 1, wherein the third pixel comprises a plurality of third dark-area pixels and a plurality of third bright-area pixels, and the first pixel comprises a plurality of first dark-area pixels and a plurality of first bright-area pixels, and the third dark-area pixels correspond to the first dark-area pixels respectively, and the third bright-area pixels correspond to and the first bright-area pixels respectively, and the phases of the lasers modulated by at least two of the first bright-area pixels adjacent to the first dark-area pixel differ by 180°.

7. The exposure device according to claim 1, further comprising a beam expander disposed on the path of the laser, and the laser passes through the beam expander to irradiate the first spatial light modulator.

8. A method for projecting a laser onto a photoresist layer using an exposure device, comprising the steps of:
  emitting a laser from a laser source;
  modulating the phase of the laser using a first spatial light modulator comprising a plurality of first pixels, wherein the first spatial light modulator is positioned upstream in the optical path;
  reflecting the phase-modulated laser onto a second spatial light modulator comprising a plurality of second pixels, wherein the second spatial light modulator is positioned downstream in the optical path;
  modulating the amplitude of the laser using the second spatial light modulator, including dynamically adjusting the contrast and intensity of the laser light;
  projecting the laser onto a photoresist layer to form an exposure pattern with high dynamic range capabilities, wherein the exposure pattern comprises a plurality of third pixels corresponding to the first and second pixels, respectively.

9. The method of claim 8, wherein the high dynamic range capability of the exposure pattern is achieved by directing the laser to specific areas on the second spatial light modulator as per the modulation by the first spatial light modulator.

10. The method of claim 8, wherein the phase of the laser is modulated by the first spatial light modulator at a kHz range speed, and the amplitude of the laser is modulated by the second spatial light modulator at a MHz range speed, and wherein the arrangement of the first spatial light modulator upstream and the second spatial light modulator downstream in the optical path leverages the speed of light to compensate for the slower modulation speed of the LCOS.

11. The method of claim 8, wherein a minor adjustment in the angle of light by the first spatial light modulator results in a significant positional shift of the light at the second spatial light modulator due to the optical path length between them, thereby enabling precise control over the distribution of light on the photoresist layer and enhancing the precision of the exposure pattern.

* * * * *